United States Patent
Kimura

(10) Patent No.: US 11,342,287 B2
(45) Date of Patent: May 24, 2022

(54) SEMICONDUCTOR DEVICE

(71) Applicant: Kioxia Corporation, Tokyo (JP)

(72) Inventor: Daisuke Kimura, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/011,152

(22) Filed: Sep. 3, 2020

(65) Prior Publication Data

US 2021/0280537 A1   Sep. 9, 2021

(30) Foreign Application Priority Data

Mar. 9, 2020 (JP) ............................. JP2020-039626

(51) Int. Cl.
| | |
|---|---|
| H01L 23/00 | (2006.01) |
| H01L 23/60 | (2006.01) |
| H01L 23/31 | (2006.01) |
| H01L 21/56 | (2006.01) |
| H01L 21/48 | (2006.01) |

(52) U.S. Cl.
CPC .......... *H01L 23/60* (2013.01); *H01L 21/4853* (2013.01); *H01L 21/565* (2013.01); *H01L 23/3128* (2013.01); *H01L 24/48* (2013.01); *H01L 2224/48225* (2013.01); *H01L 2924/30205* (2013.01)

(58) Field of Classification Search
CPC . H01L 23/60; H01L 21/4853; H01L 23/3128; H01L 24/48; H01L 2224/48225; H01L 2924/30205
USPC .......................................................... 257/668
See application file for complete search history.

(56) References Cited

U.S. PATENT DOCUMENTS

| | | |
|---|---|---|
| 2014/0197530 A1 | 7/2014 | Meyer et al. |
| 2021/0005525 A1* | 1/2021 | Okazaki .................. H01L 23/48 |

FOREIGN PATENT DOCUMENTS

| | | |
|---|---|---|
| JP | H05-251592 A | 9/1993 |
| JP | 2012-038792 A | 2/2012 |

* cited by examiner

*Primary Examiner* — Elias Ullah
(74) *Attorney, Agent, or Firm* — Foley & Lardner LLP

(57) ABSTRACT

A semiconductor device includes a substrate, a semiconductor chip, and a sealing member. The semiconductor chip is disposed on the substrate. The semiconductor chip includes a first principal surface on a side of the substrate and a second principal surface on a side opposite to the first principal surface. The sealing member seals the semiconductor chip. The sealing member includes a first sealing member and a second sealing member. The second sealing member faces at least a part of the second principal surface. A permittivity of the second sealing member is lower than a permittivity of the first sealing member.

20 Claims, 6 Drawing Sheets

SEMICONDUCTOR DEVICE

CROSS-REFERENCE TO RELATED APPLICATION

This application is based upon and claims the benefit of priority from Japanese Patent Application No. 2020-039626, filed Mar. 9, 2020, the entire contents of which are incorporated herein by reference.

FIELD

Embodiments described herein relate generally to a semiconductor device.

BACKGROUND

Semiconductor devices include, for example, a substrate, a semiconductor chip provided on the substrate, and a resin which seals the semiconductor chip. Semiconductor devices are required to have a predetermined or higher electrostatic breakdown voltage with respect to electrostatic discharge (ESD). However, with the recent advancement of semiconductor miniaturization technology, the levels of currents, voltages, and electric fields which a semiconductor chip is able to treat have been rapidly decreasing. As a result, a concern exists about a decrease in electrostatic breakdown voltage (i.e., a decrease in charged-device model (CDM) breakdown voltage) occurring due to rapid electrostatic discharge from a semiconductor chip electrically charged with static electricity. Usually, the CDM resistance decreases with increasing package capacity.

Examples of related art include JP-A-5-251592.

DETAILED DESCRIPTION

Figure 1:
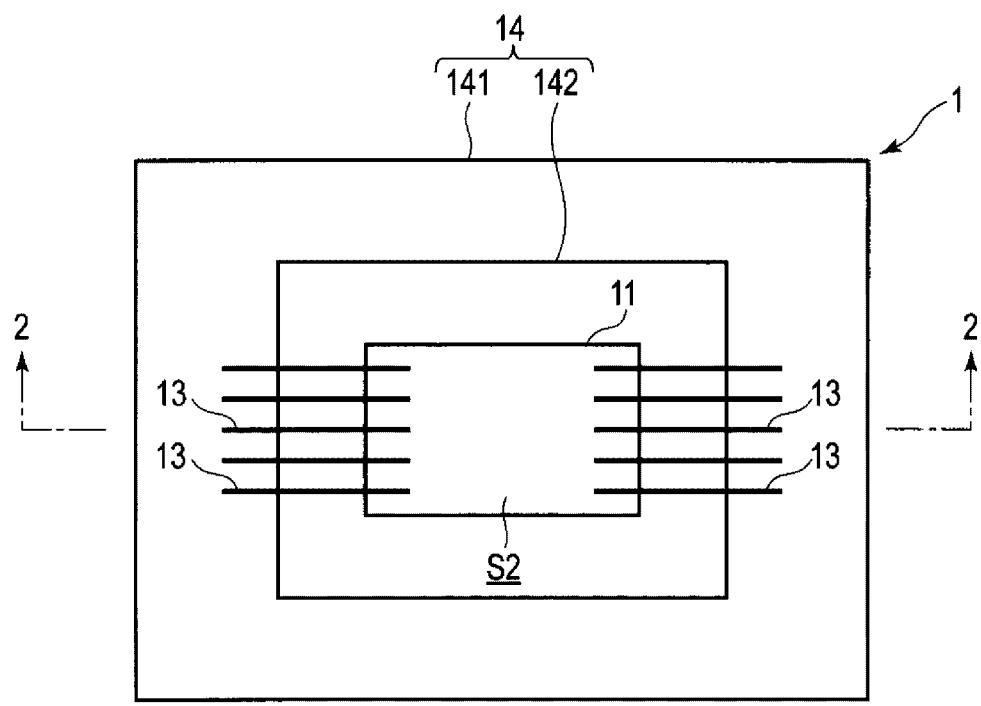
FIG. 1 is a plan view of a semiconductor device according to a first embodiment.

At least one embodiment provides a semiconductor device capable of preventing or reducing electrostatic breakdown of a semiconductor chip.

In general, according to at least one embodiment, a semiconductor device includes a substrate, a semiconductor chip, and a sealing member. The semiconductor chip is disposed on the substrate. The semiconductor chip includes a first principal surface on a side of the substrate and a second principal surface on a side opposite to the first principal surface. The sealing member seals the semiconductor chip. The sealing member includes a first sealing member and a second sealing member. The second sealing member faces at least a part of the second principal surface. A permittivity of the second sealing member is lower than a permittivity of the first sealing member.

Hereinafter, embodiments will be described with reference to the drawings. The drawings are merely schematic or conceptual. Moreover, in the drawings, the same reference numerals and signs are assigned to the respective same or equivalent portions, and any duplicated descriptions may be omitted. Moreover, for ease of explanation, even if the same or equivalent portions are present, no reference numerals and signs may be assigned thereto.

First Embodiment

Figure 2:
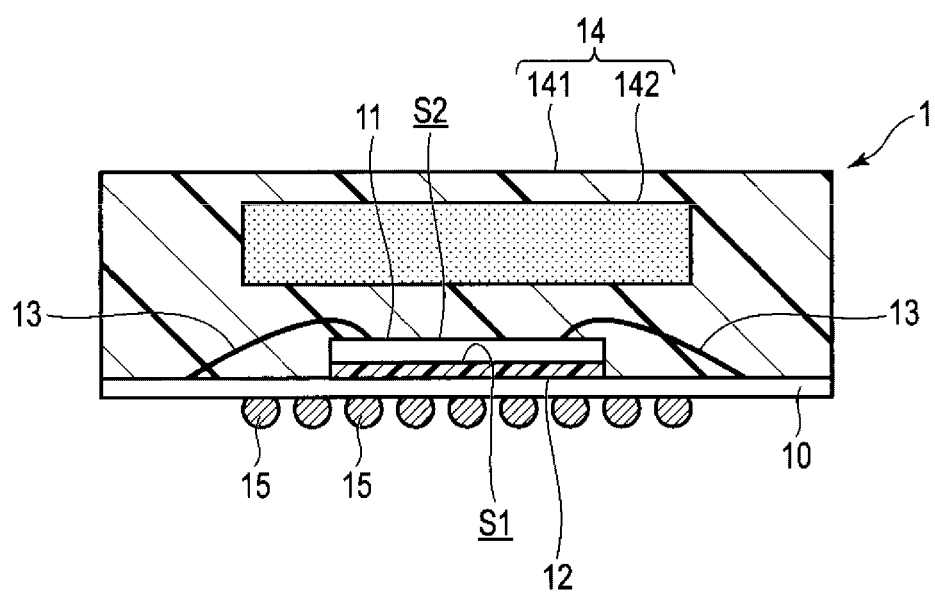
FIG. 2 is a sectional view taken along arrow line 2-2 illustrated in FIG. 1.

FIG. 1 is a plan view of a semiconductor device 1 according to a first embodiment. FIG. 2 is a sectional view taken along arrow line 2-2 illustrated in FIG. 1.

The semiconductor device 1 includes a substrate 10, a semiconductor chip 11, an adhesion layer 12, bonding wires 13, a sealing member 14, and solder balls 15.

The substrate 10 is, for example, a circuit board.

The semiconductor chip 11 is, for example, NAND-type flash memory. The semiconductor chip 11 includes a first principal surface S1 on the side of the substrate 10 and a second principal surface S2 on the opposite side. The adhesion layer 12 may be provided between the first principal surface S1 of the semiconductor chip 11 and the substrate 10. The adhesion layer 12 may be joined to the semiconductor chip 11 and the substrate 10. As a result, the semiconductor chip 11 is fixed onto the substrate 10 by the adhesion layer 12.

One end of each of the bonding wires 13 is connected to the substrate 10, and the other end of each of the bonding wires is connected to the semiconductor chip 11. The semiconductor chip 11 is electrically connected to the substrate 10 via the bonding wires 13. Referring to FIG. 1, five bonding wires 13 are connected to each of one end (e.g., the left-hand side in FIG. 1) and the other end (e.g., the right-hand side in FIG. 1) of the semiconductor chip 11. The number of bonding wires 13 may be changed as appropriate.

The sealing member 14 seals the semiconductor chip 11. The sealing member 14 includes a first sealing member 141 and a second sealing member 142.

The first sealing member 141 may include a non-porous material. The non-porous material is, for example, a thermosetting resin such as epoxy resin or polyimide resin.

The second sealing member 142 includes a porous material. The porous material is, for example, a porous resin such as a resin containing porous fillers. The permittivity of the second sealing member 142 may be smaller than the permittivity of the first sealing member 141. The second sealing member 142 may include, instead of a porous resin, a porous semiconductor (for example, porous silicon). The second sealing member 142 is provided within the first sealing member 141. The second sealing member 142 faces the entire second principal surface S2 via the first sealing member 141.

As illustrated in FIG. 1, when viewed from above the second principal surface S2, the area of the semiconductor chip 11 is smaller than the area of the second sealing member 142 and the semiconductor chip 11 is located inside the second sealing member 142. Moreover, as illustrated in FIG. 2, in at least one embodiment, the second sealing member 142 is thicker than the semiconductor chip 11.

The solder balls 15 are arranged in a lattice pattern at regular intervals (i.e., in a ball grid array (BGA) manner) on the back surface (i.e., a surface opposite to the surface on which the semiconductor chip 11 is mounted) of the substrate 10. The solder balls 15 are used as external electrode terminals. The solder balls 15 are connected onto, for example, a motherboard.

The semiconductor device 1 in the present embodiment includes the sealing member 14 including the first sealing member 141, which includes a non-porous material, and the second sealing member 142, which includes a porous material. Therefore, the semiconductor device 1 in the present embodiment is capable of preventing or reducing electrostatic breakdown of the semiconductor chip 11 caused by a package capacity (in other words, a parasitic capacitance). In the following description, this respect is further described.

In at least one embodiment, the second sealing member 142, which includes a porous material, is used as a part of the sealing member 14. Because of including a porous material, the second sealing member 142 has a reduced permittivity.

In at least one embodiment, a part of the sealing member 14 is made to be the second sealing member 142. The proportion of the second sealing member 142 to the sealing member 14 may be changed as appropriate within a range in which the required mechanical strength, moisture resistance, and insulation resistance are attained. Additionally, for example, the shape of the second sealing member 142 and the dimension of the second sealing member 142 may also be changed as appropriate within a range in which the required mechanical strength, moisture resistance, and insulation resistance are attained.

In at least one embodiment, while the second sealing member 142 is made thicker than the semiconductor chip 11, as long as the package capacity does not exceed an allowable value, the second sealing member 142 may be made thinner than the semiconductor chip 11. In this case, since it is possible to increase the proportion of the first sealing member 141 to the sealing member 14, an improvement in mechanical strength, moisture resistance, and insulation resistance can be attained.

If regions high in permittivity are unevenly distributed in the second sealing member 142, when the regions high in permittivity are electrically charged with large static electricity and electric discharge occurs with such large static electricity, the semiconductor chip 11 may break down. Therefore, it is desirable that the variation in permittivity within the second sealing member 142 be smaller. To make the distribution in permittivity within the second sealing member 142 uniform, for example, a second sealing member 142 including a resin in which the distribution of porous fillers is uniform is used.

Figure 3:
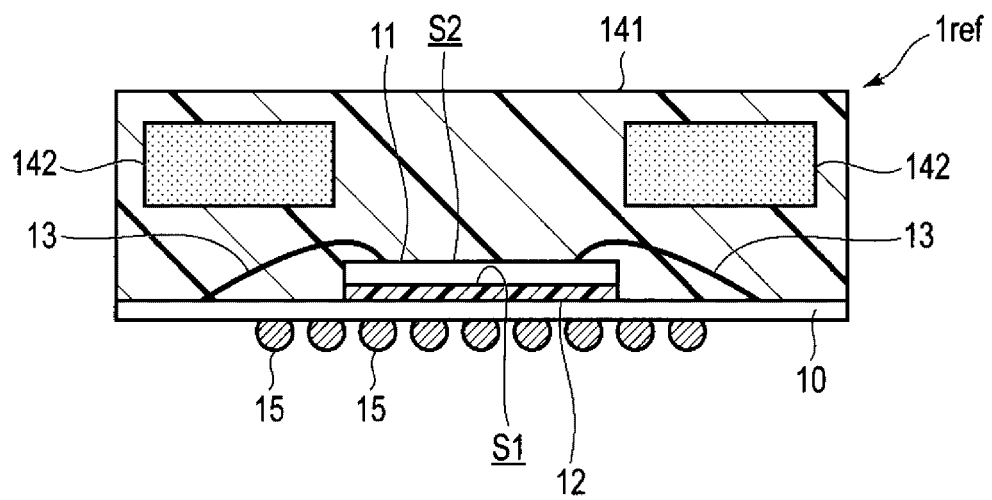
FIG. 3 is a sectional view of a semiconductor device according to a comparative example.

FIG. 3 is a sectional view of a semiconductor device according to a comparative example. Even in a semiconductor device 1ref according to the comparative example illustrated in FIG. 3, it is possible to decrease a package capacity. However, the semiconductor device 1ref according to the comparative example is inferior in an improvement of CDM resistance to the semiconductor device 1 according to at least one embodiment. The reason is that, since the second sealing member 142 with low permittivity is not located above the semiconductor chip 11 of the semiconductor device 1ref, there is a concern of rapid electrostatic discharge from the semiconductor chip 11.

Figure 4A:
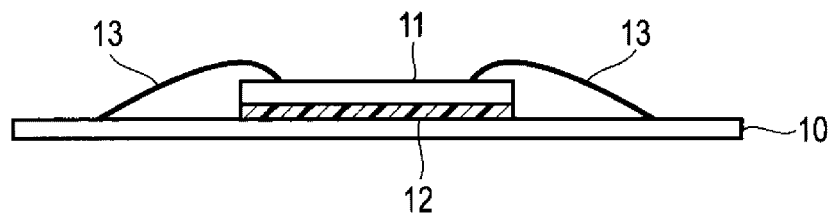
FIGS. 4A and 4B are sectional views used to explain a manufacturing process for the semiconductor device according to the first embodiment.
Figure 4B:
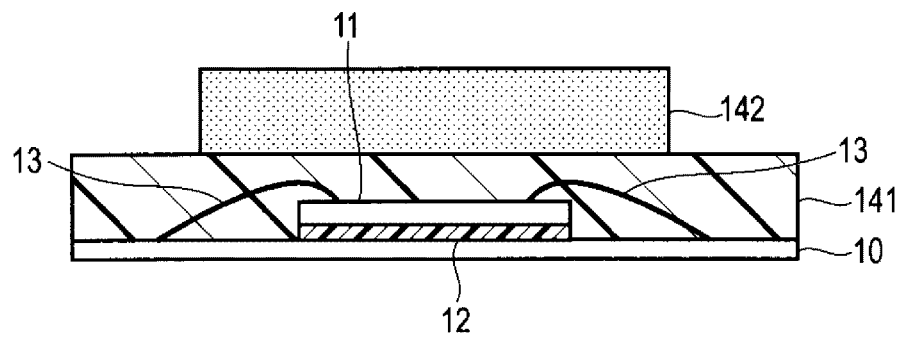

FIG. 4A is a sectional view used to explain a manufacturing process for the semiconductor device 1 according to at least one embodiment. FIG. 4B is a sectional view used to explain a manufacturing process subsequent to that illustrated in FIG. 4A.

As illustrated in FIG. 4A, the manufacturing process forms the adhesion layer 12 on the substrate 10 and then places the semiconductor chip 11 on the adhesion layer 12. The adhesion layer 12 has an adherence property with respect to the substrate 10 and the semiconductor chip 11. As a result, the semiconductor chip 11 is fixed onto the substrate 10 via the adhesion layer 12. Next, the manufacturing process interconnects the semiconductor chip 11 and the substrate 10 with use of the bonding wires 13.

As illustrated in FIG. 4B, the manufacturing process forms the first sealing member 141, which seals the semiconductor chip 11, the adhesion layer 12, and the bonding wires 13, on the substrate 10. After that, the manufacturing process forms a sealing member layer, which serves as the second sealing member 142, on the first sealing member 141 and then processes the sealing member layer using a lithography process and an etching process, for example, thus forming the second sealing member 142.

Next, the manufacturing process re-forms the first sealing member 141 in such a way as to seal the second sealing member 142, thus obtaining the first sealing member 141 having a shape illustrated in FIG. 2. After that, the manufacturing process forms the solder balls 15 according to a known process, thus obtaining the semiconductor device 1 illustrated in FIG. 2.

As mentioned above, the sealing member 14 includes the first sealing member 141 and the second sealing member 142, which is lower in permittivity than the first sealing member 141. Therefore, when, as in the present embodiment, the second sealing member 142 is located above the semiconductor chip 11, a decrease in mechanical strength, moisture resistance, and insulation resistance of the semiconductor device 1 is prevented or reduced, and a package capacity between the substrate 10 and the sealing member 14 is reduced. As a result of a reduction in package capacity being attained, electrostatic breakdown (i.e., a decrease in ESD resistance) of the semiconductor chip 11 is prevented or reduced.

Figure 5:
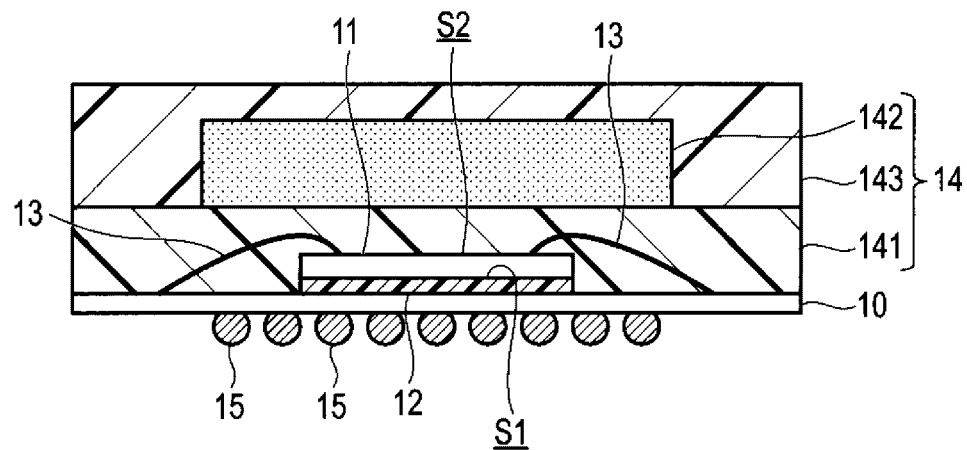
FIG. 5 is a sectional view used to explain a modification example of the first embodiment.

FIG. 5 is a sectional view used to explain a modification example of the first embodiment. In the present modification example, a sealing member 14 includes three sealing members 141, 142, and 143 which differ in permittivity from each other. For example, the permittivity of the sealing member 143 (i.e., a third sealing member) is higher than the permittivity of the second sealing member 142 and is lower than the permittivity of the first sealing member 141. To obtain the sealing member 14 illustrated in FIG. 5, for example, after forming a structure illustrated in the sectional view of FIG. 4B, the manufacturing process forms the third sealing member 143, which covers the second sealing member 142. Using the sealing member 14 including the sealing members 141, 142, and 143 which differ in permittivity from each other provides a semiconductor device that provides improved mechanical strength, moisture resistance, insulation resistance, and ESD resistance. Furthermore, a sealing member 14 including four or more sealing members which differ in permittivity from each other may be used.

Second Embodiment

Next, a second embodiment is described. The second embodiment differs from the first embodiment in including a fourth sealing member 144. In the second embodiment, a sealing member 14 includes a first sealing member 141, a second sealing member 142, and the fourth sealing member 144. The fourth sealing member 144 includes a non-porous material. The material (e.g., permittivity) of the fourth sealing member 144 is the same as the material (e.g., permittivity) of the first sealing member 141.

Figure 6:
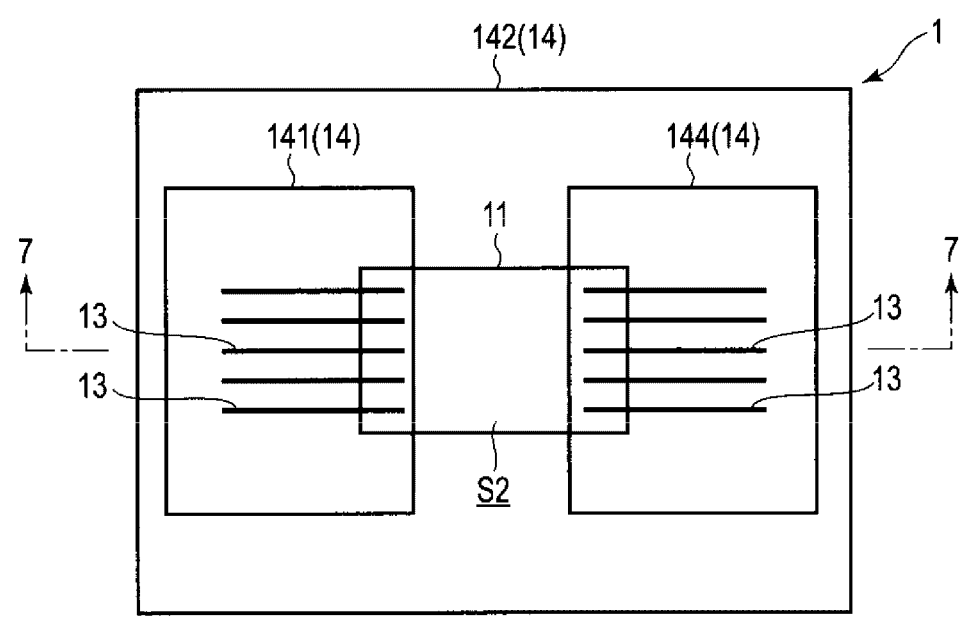
FIG. 6 is a plan view of a semiconductor device according to a second embodiment.
Figure 7:
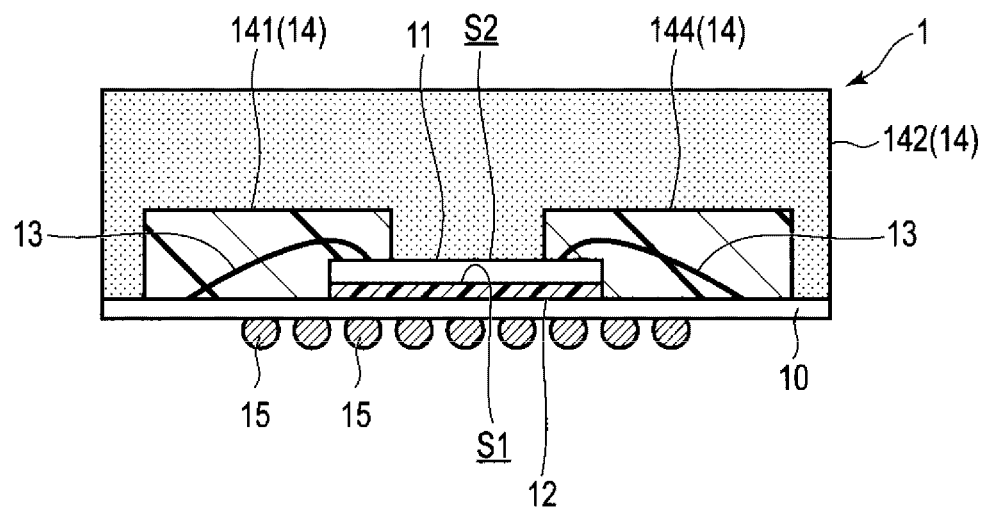
FIG. 7 is a sectional view taken along arrow line 7-7 illustrated in FIG. 6.

FIG. 6 is a plan view of a semiconductor device 1 according to the second embodiment. FIG. 7 is a sectional view taken along arrow line 7-7 illustrated in FIG. 6.

The fourth sealing member 144 and the first sealing member 141 do not overlap each other. The first and fourth sealing members 141 and 144 selectively seal regions including bonding wires 13, which are desired to have a mechanical strength, moisture resistance, and insulation resistance. The other regions are sealed by the second sealing member 142. The second sealing member 142 directly covers a portion of the second principal surface S2 located between the first sealing member 141 and the fourth sealing member 144.

In at least one embodiment, since it is possible to increase the proportion of the second sealing member 142 to the sealing member 14, electrostatic breakdown of the semiconductor chip 11 can be more effectively prevented or reduced.

The semiconductor device 1 according to at least one embodiment may be obtained by using, for example, the following manufacturing method.

First, the manufacturing method forms a structure illustrated in the sectional view of FIG. 4A used to explain an example of the method for manufacturing the semiconductor device 1 according to the first embodiment. This structure includes a substrate 10, an adhesion layer 12 provided on the substrate 10, a semiconductor chip 11 provided on the adhesion layer 12, and bonding wires 13, which interconnect the semiconductor chip 11 and the substrate 10.

Next, the manufacturing method forms a sealing member (not illustrated) including a non-porous material, which seals the semiconductor chip 11, the adhesion layer 12, and the bonding wires 13.

Next, the manufacturing method processes the above-mentioned sealing member using a lithography process and an etching process, for example, thus forming the first sealing member 141 and the fourth sealing member 144 illustrated in FIG. 7.

Next, the manufacturing method forms the second sealing member 142, which seals the semiconductor chip 11, the adhesion layer 12, and the bonding wires 13. After that, the manufacturing method forms solder balls 15 according to a known process, thus obtaining the semiconductor device 1 illustrated in FIG. 7.

Third Embodiment

Next, a third embodiment is described. The third embodiment differs from the first embodiment in that the second sealing member 142 faces a part of the principal surface S2.

Figure 8:
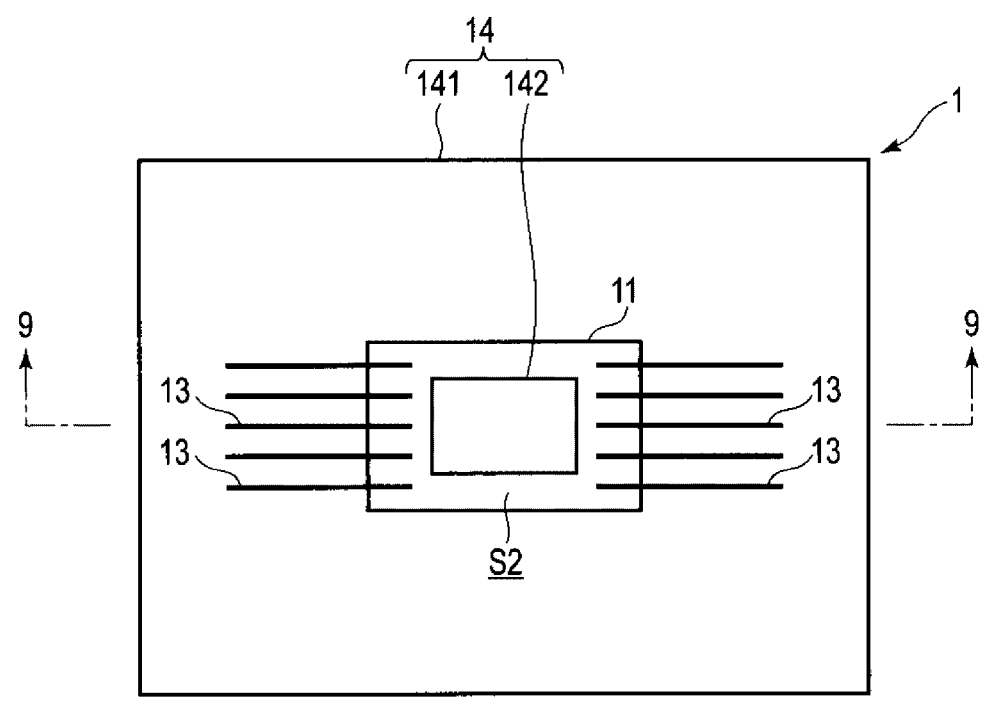
FIG. 8 is a plan view of a semiconductor device according to a third embodiment.
Figure 9:
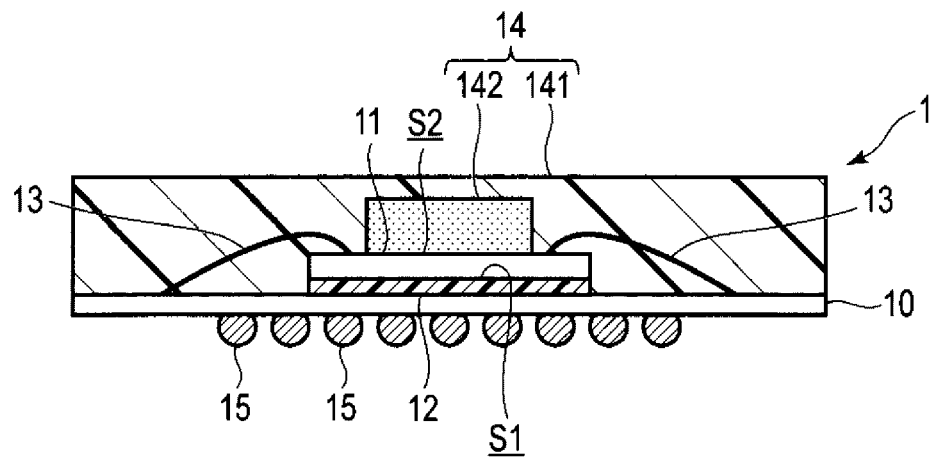
FIG. 9 is a sectional view taken along arrow line 9-9 illustrated in FIG. 8.

FIG. 8 is a plan view of a semiconductor device 1 according to the third embodiment. FIG. 9 is a sectional view taken along arrow line 9-9 illustrated in FIG. 8.

As illustrated in FIG. 8, when viewed from above the principal surface S2, the area of the second sealing member 142 is smaller than the area of the principal surface S2 and the second sealing member 142 is located inside the principal surface S2. In other words, when viewed from above the principal surface S2, the area of the second sealing member 142 in at least one embodiment is smaller than the area of the second sealing member 142 in the first and second embodiments. Moreover, the thickness of the second sealing member 142 in at least one embodiment may be smaller than the thickness of the second sealing member 142 in the first and second embodiments. Such a thin second sealing member 142 may be implemented by using, for example, a porous sheet.

The first sealing member 141 seals the semiconductor chip 11, the adhesion layer 12, the bonding wires 13, and the second sealing member 142.

Furthermore, while, in at least one embodiment, the second sealing member 142 directly faces apart of the principal surface S2, the second sealing member 142 may indirectly face a part of the principal surface S2 via a member (not illustrated). In this case, from the viewpoint of preventing or reducing electrostatic breakdown of the semiconductor chip 11, it is favorable that the permittivity of the above-mentioned member (not illustrated) is equal to or lower than the permittivity of the second sealing member 142.

Moreover, the thickness of the second sealing member 142 in at least one embodiment may be smaller than the thickness of the second sealing member 142 in the first and second embodiments. Such a thin second sealing member 142 is implemented by using, for example, a porous sheet. This causes the volume of the second sealing member 142 in at least one embodiment to be smaller than the volume of the second sealing member 142 in the first and second embodiments.

Even the present embodiment is able to attain advantageous effects similar to those in the first embodiment. Additionally, in the present embodiment, since the second sealing member 142 only needs to have a small area or volume, the semiconductor device 1 according to at least one embodiment has the advantage of being able to readily cope with the future advancement of semiconductor miniaturization technology.

Figure 10A:
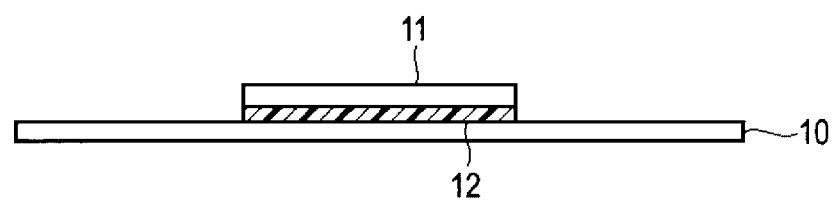
FIGS. 10A, 10B, and 10C are sectional views used to explain a manufacturing process for the semiconductor device according to the third embodiment.
Figure 10B:
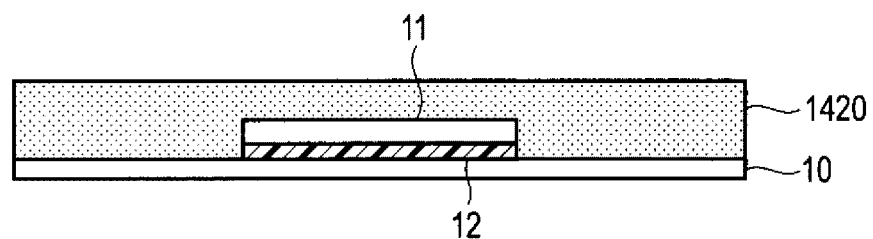
Figure 10C:
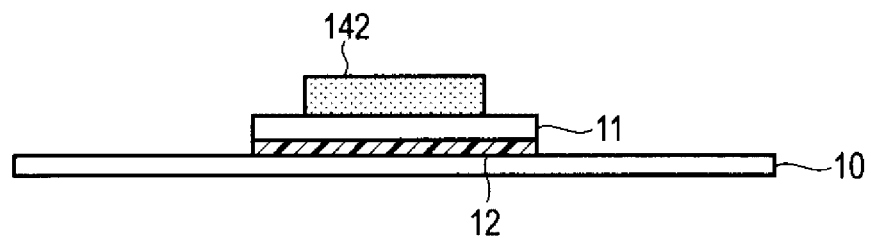

FIG. 10A is a sectional view used to explain a manufacturing process for the semiconductor device 1 according to at least one embodiment. FIG. 10B is a sectional view used to explain the manufacturing process subsequent to FIG. 10A. FIG. 10C is a sectional view used to explain the manufacturing process subsequent to FIG. 10B.

As illustrated in FIG. 10A, the manufacturing process forms the adhesion layer 12 on the substrate 10 and then places the semiconductor chip 11 on the adhesion layer 12, thus fixing the semiconductor chip 11 onto the substrate 10 via the adhesion layer 12.

Next, as illustrated in FIG. 10B, the manufacturing process forms a sealing member 1420 including a porous material, which seals the semiconductor chip 11, the adhesion layer 12, and the bonding wires 13, on the substrate 10. The dimension of the sealing member 1420 obtained at this stage is different from the dimension of the second sealing member 142 illustrated in FIG. 8.

Next, the manufacturing process processes the sealing member 1420 using a lithography process and an etching process, for example, thus forming a second sealing member 142 as illustrated in FIG. 10C.

After that, the manufacturing process forms the bonding wires 13, forms the first sealing member 141, and forms the solder balls 15, thus obtaining the semiconductor device 1 illustrated in FIG. 9.

Figure 11:
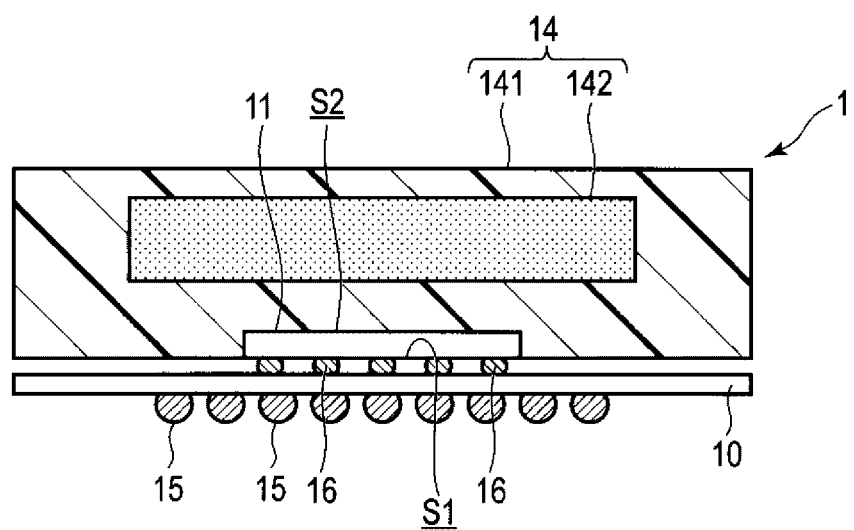
FIG. 11 is a sectional view used to explain a modification example of each embodiment.

FIG. 11 is a sectional view used to explain a modification example of each embodiment. In this modification example, bump electrodes 16 are used to connect the element forming surface side of the semiconductor chip 11 to the substrate 10. Thus, each of the above-described embodiments may also be applied to a semiconductor device with facedown mounting employed therefor. Furthermore, connection between the semiconductor chip 11 and the substrate 10 may also be performed with use of connection members other than the bonding wires 13 and the bump electrodes 16.

Moreover, while, in the first to third embodiments, the shapes of the substrate 10, the semiconductor chip 11, and the sealing member 14 (i.e., each of the sealing members 141 to 144) are rectangular, other shapes of the substrate 10, the semiconductor chip 11, and the sealing member 14 (i.e., each of the sealing members 141 to 144) may be employed.

Additionally, while the semiconductor device 1 according to each of the first to third embodiments employs a ball grid array (BGA) package, another type of package (for example, a thin small outline package (TSOP)) may be employed.

A part or the whole of each of a broader concept, middle-level concept, and narrower concept of each of the above-described embodiments and other embodiments not described above are able to be expressed by, for example, the following supplementary notes 1 to 18 and any consistent combination of some or all of the supplementary notes 1 to 18.

[Supplementary Note 1]

A semiconductor device including:

a substrate;

a semiconductor chip provided on the substrate and including a first principal surface on a side of the substrate and a second principal surface on a side opposite to the first principal surface; and a sealing member sealing the semiconductor chip and including a first sealing member and a second sealing member, the second sealing member facing at least a part of the second principal surface, and a permittivity of the second sealing member being lower than a permittivity of the first sealing member.

[Supplementary Note 2]

The semiconductor device set forth in supplementary note 1, in which the first sealing member includes a non-porous material, and the second sealing member includes a porous material.

[Supplementary Note 3]

The semiconductor device set forth in supplementary note 2, in which the non-porous material includes a non-porous resin, and the porous material includes a porous resin or a porous semiconductor.

[Supplementary Note 4]

The semiconductor device set forth in any one of supplementary notes 1 to 3, in which the second sealing member faces an entirety of the second principal surface.

[Supplementary Note 5]

The semiconductor device set forth in supplementary note 4, in which the second sealing member faces the entirety of the second principal surface via the first sealing member.

[Supplementary Note 6]

The semiconductor device set forth in any one of supplementary notes 1 to 5, in which, when viewed from above the second principal surface, an area of the semiconductor chip is smaller than an area of the second sealing member, and the semiconductor chip is located inside the second sealing member.

[Supplementary Note 7]

The semiconductor device set forth in any one of supplementary notes 1 to 6, further including a third sealing member sealing the second sealing member.

[Supplementary Note 8]

The semiconductor device set forth in supplementary note 7, in which a permittivity of the third sealing member is higher than the permittivity of the second sealing member and is lower than the permittivity of the first sealing member.

[Supplementary Note 9]

The semiconductor device set forth in any one of supplementary notes 1 to 3, further including a fourth sealing member, in which a permittivity of the fourth sealing member is equal to the permittivity of the first sealing member, and the first sealing member and the fourth sealing member face a part of the semiconductor chip.

[Supplementary Note 10]

The semiconductor device set forth in supplementary note 9, in which, when viewed from above the second principal surface, the first sealing member and the fourth sealing member do not overlap each other.

[Supplementary Note 11]

The semiconductor device set forth in supplementary note 10, further including first and second bonding wires interconnecting the semiconductor chip and the substrate, in which the first and fourth sealing members seal the first and second bonding wires, respectively.

[Supplementary Note 12]

The semiconductor device set forth in supplementary note 11, in which the second sealing member covers a portion of the second principal surface located between the first sealing member and the fourth sealing member.

[Supplementary Note 13]

The semiconductor device set forth in supplementary note 12, in which the second sealing member further covers the first sealing member and the fourth sealing member.

[Supplementary Note 14]

The semiconductor device set forth in supplementary note 1, in which the second sealing member faces a part of the second principal surface.

[Supplementary Note 15]

The semiconductor device set forth in supplementary note 14, in which, when viewed from above the second principal surface, an area of the second sealing member is smaller than an area of the semiconductor chip, and the second sealing member is located inside the second principal surface.

[Supplementary Note 16]

The semiconductor device set forth in supplementary note 14 or 15, in which the first sealing member seals the semiconductor chip and the second sealing member.

[Supplementary Note 17]

The semiconductor device set forth in any one of supplementary notes 14 to 16, in which the second sealing member directly faces the part of the second principal surface.

[Supplementary Note 18]

The semiconductor device set forth in any one of supplementary notes 1 to 17, in which the second sealing member is thicker than the semiconductor chip.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a substrate;
   a semiconductor chip disposed on the substrate, the semiconductor chip including a first surface on a side facing the substrate and a second surface on a side opposite to the first surface; and
   a sealing member sealing the semiconductor chip, the sealing member including a first sealing member and a second sealing member, the second sealing member facing at least a part of the second surface, and a permittivity of the second sealing member being lower than a permittivity of the first sealing member,
   wherein the second sealing member faces a center of the second surface of the semiconductor chip, and
   wherein the first sealing member faces at least a side of the second surface of the semiconductor chip.

2. The semiconductor device according to claim 1, wherein the first sealing member includes a non-porous material, and the second sealing member includes a porous material.

3. The semiconductor device according to claim 2, wherein the non-porous material includes a non-porous resin, and the porous material includes a porous resin or a porous semiconductor.

4. The semiconductor device according to claim 1, wherein the second sealing member faces an entirety of the second surface.

5. The semiconductor device according to claim 4, wherein the second sealing member faces the entirety of the second surface via the first sealing member.

6. The semiconductor device according to claim 1, wherein, when viewed from above the second surface, an area of the semiconductor chip is smaller than an area of the second sealing member, and the semiconductor chip is located within a boundary of the second sealing member.

7. The semiconductor device according to claim 1, further comprising a third sealing member sealing the second sealing member.

8. The semiconductor device according to claim 7, wherein a permittivity of the third sealing member is (a) higher than the permittivity of the second sealing member and (b) lower than the permittivity of the first sealing member.

9. The semiconductor device according to claim 1, further comprising a fourth sealing member,
   wherein a permittivity of the fourth sealing member is equal to the permittivity of the first sealing member, and
   the first sealing member and the fourth sealing member face a part of the semiconductor chip.

10. The semiconductor device according to claim 9, wherein, when viewed from above the second surface, the first sealing member and the fourth sealing member do not overlap each other.

11. The semiconductor device according to claim 10, further comprising first and second bonding wires interconnecting the semiconductor chip and the substrate,
    wherein the first and fourth sealing members seal the first and second bonding wires, respectively.

12. The semiconductor device according to claim 11, wherein the second sealing member covers a portion of the second surface located between the first sealing member and the fourth sealing member.

13. The semiconductor device according to claim 12, wherein the second sealing member further covers the first sealing member and the fourth sealing member.

14. The semiconductor device according to claim 1, wherein the second sealing member faces a part of the second surface.

15. The semiconductor device according to claim 14, wherein, when viewed from above the second surface, an area of the second sealing member is smaller than an area of the semiconductor chip, and the second sealing member is located within a boundary of the second surface.

16. The semiconductor device according to claim 14, wherein the first sealing member seals the semiconductor chip and the second sealing member.

17. The semiconductor device according to claim 14, wherein the second sealing member directly faces the part of the second surface.

18. The semiconductor device according to claim 1, wherein the second sealing member is thicker than the semiconductor chip.

19. The semiconductor device according to claim 1, wherein the second sealing member is thinner than the semiconductor chip.

20. The semiconductor device according to claim 1, wherein the permittivity is uniform within the second sealing member.

* * * * *